United States Patent
Levy et al.

(10) Patent No.: US 8,637,921 B2
(45) Date of Patent: Jan. 28, 2014

(54) NITRIDATION OXIDATION OF TUNNELING LAYER FOR IMPROVED SONOS SPEED AND RETENTION

(75) Inventors: Sagy Levy, Yaakov (IL); Krishnaswamy Ramkumar, San Jose, CA (US); Fredrick B. Jenne, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 498 days.

(21) Appl. No.: 12/005,813

(22) Filed: Dec. 27, 2007

(65) Prior Publication Data

US 2009/0032863 A1   Feb. 5, 2009

Related U.S. Application Data

(60) Provisional application No. 60/940,384, filed on May 25, 2007.

(51) Int. Cl.
*H01L 29/792* (2006.01)
(52) U.S. Cl.
USPC ............ 257/325; 257/324; 257/E29.309; 257/E29.042; 257/E29.179; 257/E29.304; 257/321; 438/287; 438/261
(58) Field of Classification Search
None
See application file for complete search history.

(56) References Cited

U.S. PATENT DOCUMENTS

| | | | |
|---|---|---|---|
| 5,500,816 A * | 3/1996 | Kobayashi | 365/185.28 |
| 6,001,713 A * | 12/1999 | Ramsbey et al. | 438/520 |
| 6,136,654 A * | 10/2000 | Kraft et al. | 438/287 |
| 6,461,899 B1 | 10/2002 | Kitakado et al. | |
| 6,610,614 B2 * | 8/2003 | Niimi et al. | 438/775 |
| 6,818,558 B1 | 11/2004 | Rathor et al. | |
| 6,917,072 B2 | 7/2005 | Noguchi et al. | |
| 7,084,032 B2 | 8/2006 | Crivelli et al. | |
| 7,301,185 B2 | 11/2007 | Chen et al. | |
| 7,338,869 B2 | 3/2008 | Fukuda et al. | |
| 7,521,751 B2 | 4/2009 | Fujiwara | |
| 7,535,053 B2 | 5/2009 | Yamazaki | |
| 7,601,576 B2 | 10/2009 | Suzuki | |
| 2002/0020890 A1 * | 2/2002 | Willer | 257/390 |
| 2002/0141237 A1 * | 10/2002 | Goda et al. | 365/185.03 |
| 2003/0122204 A1 | 7/2003 | Nomoto et al. | |
| 2003/0183869 A1 | 10/2003 | Crivelli et al. | |
| 2004/0094793 A1 | 5/2004 | Noguchi et al. | |
| 2004/0104424 A1 | 6/2004 | Yamazaki | |
| 2004/0183091 A1 * | 9/2004 | Hibino | 257/104 |
| 2004/0227198 A1 * | 11/2004 | Mitani et al. | 257/410 |

(Continued)

OTHER PUBLICATIONS

Chen, Tung-Sheng, et al., "Performance Improvement of Sonos Memory by Bandgap Engineering of Charge-Trapping Layer", *IEEE Electron Device Letters*, Apr. 2004, pp. 205-207, vol. 25, No. 4.

(Continued)

*Primary Examiner* — Fei Fei Yeung Lopez (57) ABSTRACT

A method for forming a tunneling layer of a nonvolatile trapped-charge memory device and the article made thereby. The method includes multiple oxidation and nitridation operations to provide a dielectric constant higher than that of a pure silicon dioxide tunneling layer but with a fewer hydrogen and nitrogen traps than a tunneling layer having nitrogen at the substrate interface. The method provides for an improved memory window in a SONOS-type device. In one embodiment, the method includes an oxidation, a nitridation, a reoxidation and a renitridation. In one implementation, the first oxidation is performed with $O_2$ and the reoxidation is performed with NO.

10 Claims, 6 Drawing Sheets

(56) References Cited

U.S. PATENT DOCUMENTS

| | | | |
|---|---|---|---|
| 2005/0070126 | A1 | 3/2005 | Senzaki |
| 2005/0093054 | A1 | 5/2005 | Jung |
| 2005/0098839 | A1 | 5/2005 | Lee et al. |
| 2005/0227501 | A1* | 10/2005 | Tanabe et al. ............... 438/787 |
| 2005/0245034 | A1 | 11/2005 | Fukuda et al. |
| 2005/0266637 | A1 | 12/2005 | Wang |
| 2006/0065919 | A1 | 3/2006 | Fujiwara |
| 2006/0113586 | A1 | 6/2006 | Wang |
| 2006/0113627 | A1 | 6/2006 | Chen et al. |
| 2006/0220106 | A1 | 10/2006 | Choi et al. |
| 2006/0228841 | A1* | 10/2006 | Kim et al. ............... 438/164 |
| 2007/0048916 | A1 | 3/2007 | Suzuki et al. |
| 2007/0049048 | A1* | 3/2007 | Rauf et al. ............... 438/775 |
| 2008/0029399 | A1 | 2/2008 | Tomita et al. |
| 2008/0150003 | A1 | 6/2008 | Chen et al. |
| 2008/0272424 | A1 | 11/2008 | Kim et al. |

OTHER PUBLICATIONS

Lue, Hang-Ting, et al., "BE-SONOS: A Bandgap Engineered Sonos With Excellent Performance and Reliability", *IEEE*, 2005, 4 pgs.

Lue, Hang-Ting, et al., "Reliability Model of Bandgap Engineered SONOS (BE-SONOS)", *IEEE* 2006 4 pgs.

Wang, Szu-Yu, et al., "Reliability and Processing Effects of Bandgap Engineered SONOS (BE-SONOS) Flash Memory", *2007 IEEE International Reliability Symposium*, Apr. 18, 2007, 5 pgs,.

Wu, Kuo-Hong, et al., "Sonos Device With Tapered Bandgap Nitride Layer", *IEEE Transactions on Electron Devices*, May 2005, pp. 987-992, vol. 52, No. 5.

USPTO Non-Final Rejection for U.S. Appl. No. 11/904,506 dated Aug. 31, 2010; 17 pages.

PCT International Search Report and Written Opinion of the International Searching Authority, PCT/US/20966, filed Sep. 28, 2007, mailed Apr. 21, 2008; 11 pages.

USPTO Requirement Restriction for U.S. Appl. No. 11/904,506 dated Apr. 13, 2010; 7 pages.

U.S. Appl. No. 11/904,506; "SONOS ONO stack scaling," Fredrick B. Jenne, filed Sep. 26, 2007; 46 pages.

U.S. Appl. No. 13/539,461 "SONOS ONO Stack Scaling," Fredrick Jenne, filed Jul. 1, 2012; pages.

U.S. Appl. No. 60/940,384; "SONOS ONO STACK SCALING" Frederick Jenne et al., filed May 25, 2007; 3 Pages.

International Search Report for International Application No. PCT/US07/20966 dated Apr. 21, 2008; 2 pages.

SIPO Office Action for Application No. 200780035963.3 dated Feb. 29, 2012; 4 pages.

USPTO Advisory Action for U.S. Appl. No. 11/904,506 dated Aug. 30, 2011; 4 pages.

USPTO Final Rejection for U.S. Appl. No. 11/904,506 dated Jun. 7, 2011; 15 pages.

USPTO Final Rejection for U.S. Appl. No. 12/005,813 dated Mar. 6, 2012; 5 pages.

USPTO Non Final Rejection for U.S. Appl. No. 11/904,505 dated Feb. 3, 2011; 13 pages.

USPTO Non Final Rejection for U.S. Appl. No. 11/904,506 dated Aug. 31, 2010; 17 pages.

USPTO Non Final Rejection for U.S. Appl. No. 12/005;813 dated Sep. 23, 2011; 12 pages.

USPTO Requirement for Restriction for U.S. Appl. No. 11/904,506 dated Apr. 13, 2010; 7 pages.

Written Opinion of the Intenational Searching Authority for International Application No. PCT/US07/20966, mailed Apr. 21, 2008; 1 pages.

Yang et al., "Reliability considerations in scaled SONOS nonvolatile memory devices, solid state Electronics", 43(1999) 2025-2032.

U.S. Appl. No. 13/428,201; "Method of Integrating a Charge-Trapping Gate Stack Into a CMOS Flow"; Krishriaswamy Ramkumar et al., filed Mar. 23, 2012; 38 Pages.

U.S. Appl. No. 13/431,069: "SONOS Stack With Split Nitride Memory Layer" Fredrick Jenne et al., filed Mar. 27, 2012; 59 pages.

U.S. Appl. No. 13/436,872: "Oxide-Nitride-Oxide Stack Having Multiple Oxynitride Layers" Sagy Levy, Zichron-Yoakev et al., filed Mar. 31, 2012; 53 pages.

U.S. Appl. No. 13/436,875: "Nonvolatile Charge Trap Memory Device Having a High Dielectric Constant Blocking Region" Igor Polishchuk et al., filed Mar. 31, 2012; 70 Pages.

U.S. Appl. No. 13/436,878: "Integration of Non-Volatile Charge Trap Memory Devices And Logic CMOS Devices" Krishnaswamy Ramkumar et al., filed Mar. 31, 2012; 90 pages.

U.S. Appl. No. 13/551,237: "SONOS Stack With Split Nitride Memory Layer" Fredrick Jenne et al., filed Jul. 17, 2012, 37 pages.

U.S. Appl. No. 13/620,071: "Method of Fabricating a Nonvolatile Charge Trap Memory Device" Kristmaswarny Ramkumar et al., filled Sep. 14, 2012; 69 pages.

U.S. Appl. No. 60/931,947 "Oxide-nitride-Oxide Stack Having Multiple Oxynitride Layers"0 Sagy Levy et al., filed May 25, 2007; 27 pages.

U.S. Appl. No. 60/931,948: "SONOS stack with oxynitride bilayer made of BTBAS and NH3" Sagy Levy et al., filed May 25, 2307; 11 Pages.

U.S. Appl. No. 60/940,128: "Single Wafer Process for ONO Stack" Krishnaswamy Rarnkumar et al., filed May 25, 2007; 3 pages.

U.S. Appl. No. 61/007,566: "Nonvolatile Charge Trap Memory Device Having A High Dielectric Constant Blocking Region" Igor Polishchuk et al., filed Dec. 12, 2007; 37 pages.

U.S. Appl. No. 61/172,320: "SONOS stack With Superior Reliability" Fredrick Jenne et al., filed Apr. 24, 2009; 3 pages.

U.S. Appl. No. 61/599,258 "New Integration of SONOS Stack" Krishnaswamy Ramkumar et al., filed Feb. 15, 2012; 4 pages.

International Search Report for International Application No. PCT/US07/20988 dated Mar. 14, 2008; 2 pages.

International Search Report for International Application No. PCT/US12/021583 dated Jul. 19, 2012; 2 pages.

PCT International Search Report and Written Opinion of the International Searching Authority, PCT/US07/20965 filed Sep. 28, 2007, mailed Apr. 21, 2008.

USPTO Final Rejection for U.S. Appl. No. 12/030,644 dated Jan. 24, 2011; 22 pages.

USPTO Final Rejection for U.S. Appl. No. 13/114,889 dated Apr. 2, 2013; 12 pages.

USPTO Miscellaneous Internal Document for U.S. Appl. No. 12/030,644 dated May 28, 2010; 6 pages.

USPTO Non Final Rejection for U.S. Appl. No. 12/030,644 dated May 28, 2010; 19 pages.

USPTO Requirement for Restriction for U.S. Appl. No. 13/114,889 dated Sep. 7, 2011; 6 pages.

Written Opinion of the International Searching Authority for International Application No. PCT/US07/20988 mailed Mar. 14, 2008; 1 page.

Written Opinion of the International Searching Authority for International Application No. PCT/US12/021583 mailed May 8, 2012; 4 pages.

\* cited by examiner

(PRIOR ART)

FIG. 6

NITRIDATION OXIDATION OF TUNNELING LAYER FOR IMPROVED SONOS SPEED AND RETENTION

CROSS REFERENCE TO RELATED APPLICATIONS

This application claims the benefit of U.S. Provisional Application No. 60/940,384, filed May 25, 2007, the entire contents of which are hereby incorporated by reference herein.

FIELD

Embodiments of the present invention relate to the electronics manufacturing industry and more particularly to fabrication of nonvolatile trapped-charge memory devices.

BACKGROUND

Figure 1:
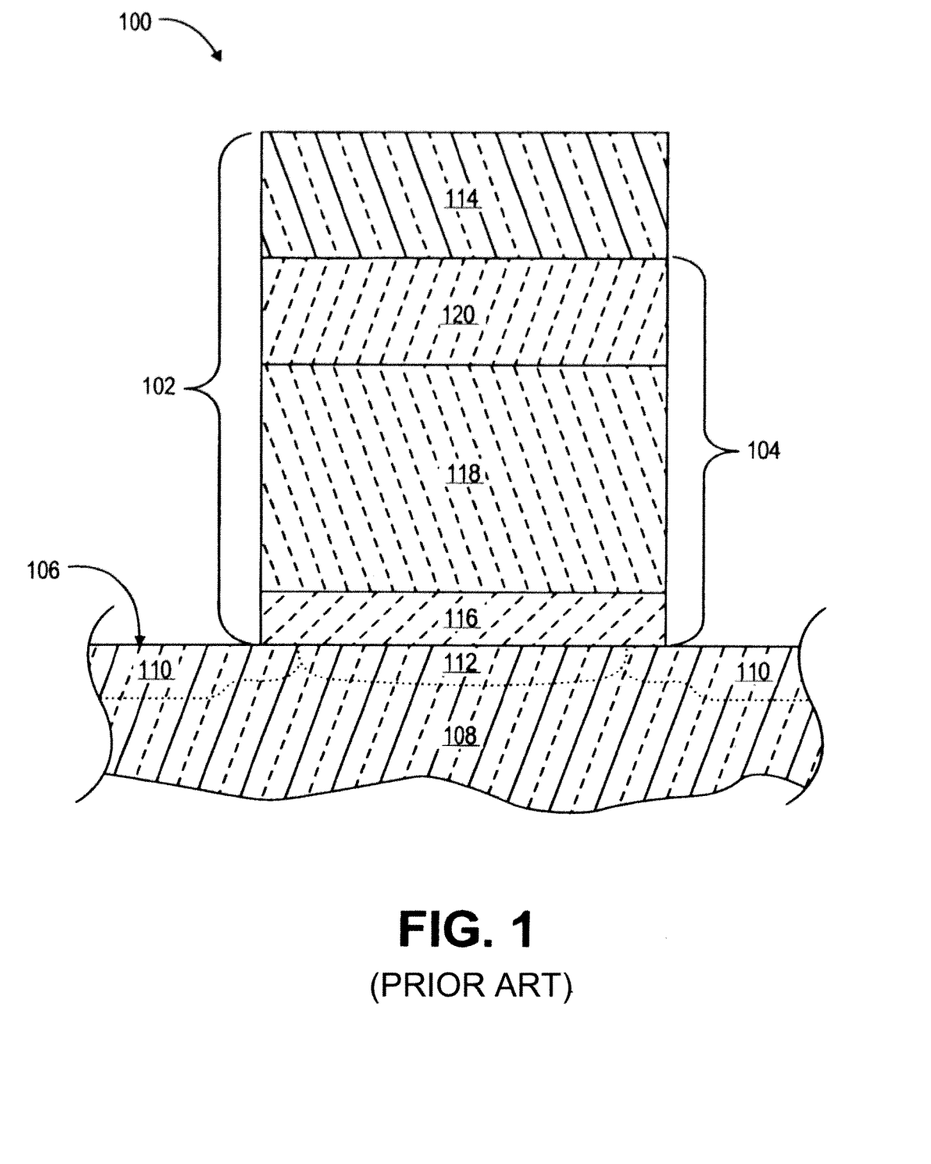
FIG. 1 illustrates a cross sectional view of an intermediate structure for a conventional SONOS device.

FIG. 1 is a partial cross-sectional view of an intermediate structure for a semiconductor device 100 having a semiconductor-oxide-nitride-oxide-semiconductor (SONOS) gate stack 102 including a conventional oxide-nitride-oxide (ONO) stack 104 formed over a surface 106 of a semiconductor substrate 108 according to a conventional method. The device 100 typically further includes one or more diffusion regions 110, such as source and drain regions, aligned to the gate stack and separated by a channel region 112. The SONOS gate stack 102 includes a poly-silicon (poly) gate layer 114 formed upon and in contact with the ONO stack 104. The poly gate 114 is separated or electrically isolated from the substrate 108 by the ONO stack 104. The ONO stack 104 generally includes a silicon oxide tunneling layer 116, a silicon nitride charge trapping layer 118 which serves as a charge storing or memory layer for the device 100, and a silicon oxide blocking layer 120 overlying the charge trapping layer 118.

Such SONOS-type transistors are useful for non-volatile memory (NVM). The charge trapping layer stores charge to provide non-volatility. To program (i.e. write to) the n-channel SONOS-type device, a positive voltage is applied to the control gate ($V_{CG}$) while the source, body and drain are grounded. The positive $V_{CG}$ produces a field across the SONOS stack resulting in some negative charge at the conduction band energy level in the buried channel of silicon substrate channel to undergo Fowler-Nordheim tunneling (FNT) through the tunneling layer and into the charge trapping layer. The holes are stored in traps having mid gap energy levels in the charge trapping layer. To erase the n-channel SONOS device, a negative voltage is applied to the control gate. The negative $V_{CG}$ produces a field across the SONOS stack attracting hole tunneling charge through tunneling layer and into the charge trapping layer.

Figure 2:
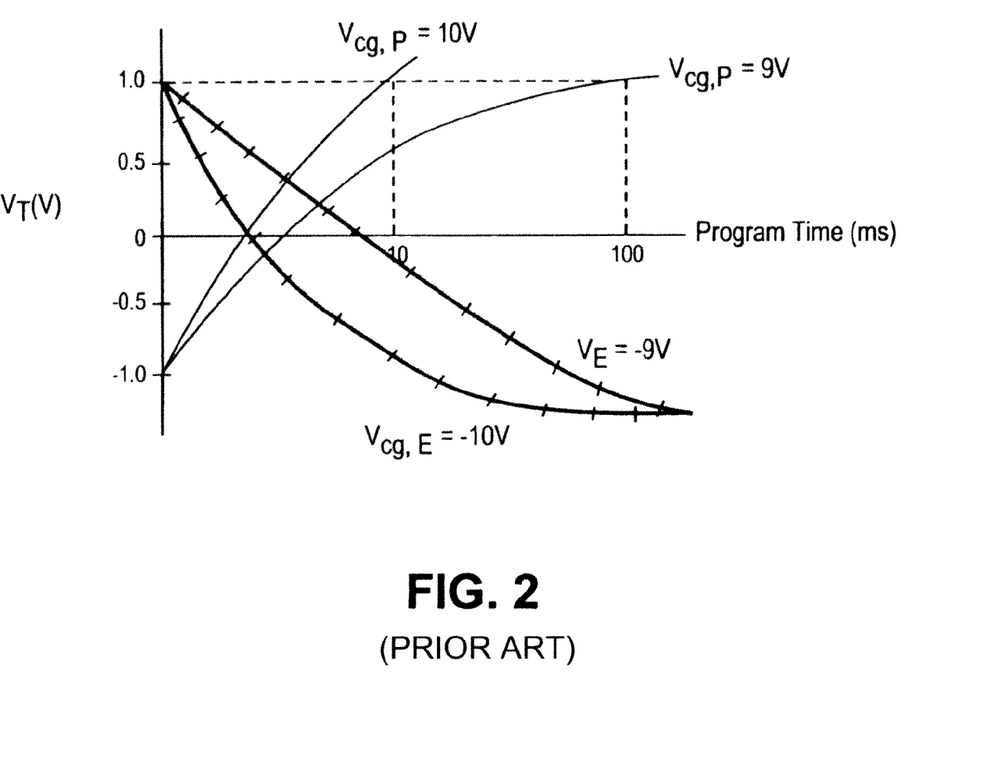
FIG. 2 depicts programming and erase times for a conventional SONOS device employing a conventional ONO stack.

SONOS-type devices are gaining in popularity for high density memory applications, such as embedded NVM. An advantage of SONOS over other NVM devices is scalability. With proper scaling, there exists potential in SONOS to achieve a memory technology operable in the 5 volt (V) range, rather than the 10 V range of conventional SONOS-type devices or 12 V-15 V range of conventional flash technology. SONOS-type devices operable at low voltages (approaching 5 V) are advantageously compatible with low voltage CMOS. However, successful scaling of SONOS-type devices is non-trivial. For example, FIG. 2 depicts programming and erase times for a conventional SONOS device employing a conventional ONO stack comprised of a 10 nm thick silicon oxide blocking layer, a 7 nm thick silicon nitride charge trapping layer, and a 3 nm thick silicon dioxide tunneling layer. As shown, the programming/erase time increases dramatically when $V_{CG}$ is scaled down. Generally, program/erase times less than 1 ms are required for embedded memory applications. However, such 1 millisecond (ms) program/erase times may be achieved in the conventional SONOS stack only with a $V_{CG}$ of +/−10 V. Conventional SONOS program/erase times extend to 100 ms or more when $V_{CG}$ is reduced to approximately +/−9 V.

Furthermore, reducing the programming voltage results in a reduction of the erase of program window (i.e. memory window). This is because the electric field is across the ONO stack is reduced if the equivalent oxide thickness (EOT) of the entire ONO stack is not scaled down as the voltage is reduced. Reducing the EOT of the stack is non-trivial because reducing the tunneling layer thickness to allow the same initial erase level at a lower applied voltage ($V_{CG}$) can result in a detrimental increase in the erase and program decay rate.

Similarly, where improved charge retention is desired for any given programming voltage, reduction of EOT of the tunneling layer for a given physical thickness of the tunneling layer is desirable.

DESCRIPTION OF THE DRAWINGS

Embodiments of the present invention are illustrated by way of example, and not limitation, in the figures of the accompanying drawings in which.

DETAILED DESCRIPTION

Embodiments of a nonvolatile trapped-charge memory device employing a nitridized oxide tunneling layer are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Embodiments of the present invention include a tunneling layer having a nonvolatile trapped-charge memory device with a tunneling layer including a nitridized oxide to reduce the equivalent oxide thickness of the tunneling layer relative to a silicon dioxide tunneling layer. Embodiments of the present invention include methods for nitridizing a silicon dioxide layer to form a nitridized oxide tunneling layer of a nonvolatile trapped-charge memory device. In accordance with one embodiment of the present invention, the nonvolatile trapped-charge memory device is a SONOS-type device wherein a charge-trapping layer is an insulator layer, such as a nitride. In another embodiment, the nonvolatile trapped-charge memory device is a Flash-type device wherein the charge-trapping layer is a conductor layer or a semiconductor layer, such as poly-silicon. Nonvolatile trapped-charge memory devices employing the nitridized oxide tunneling layer may enable a lower programming or erase voltage while providing an erase voltage threshold level (VTP/VTE) as good as or better than a conventional device.

Figure 3:
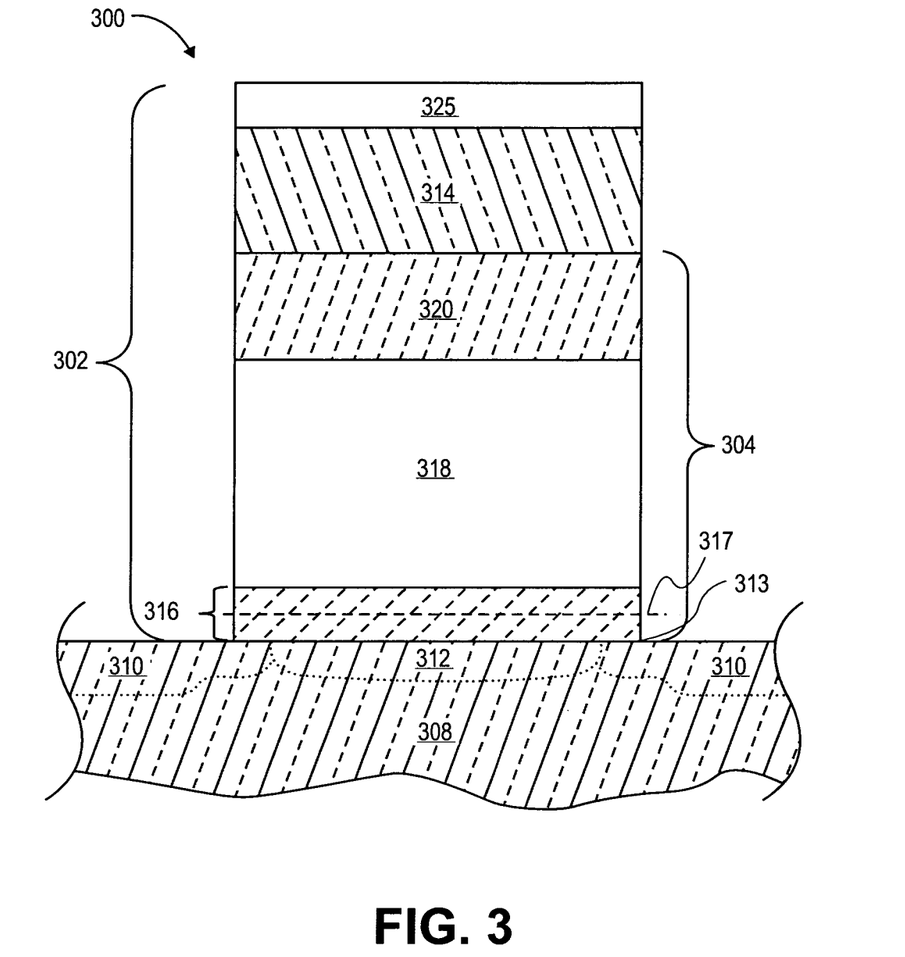
FIG. 3 illustrates a cross-sectional side view of a portion of a nonvolatile trapped-charge memory device having an ONO structure including a nitridized oxide tunneling layer according to an embodiment of the present invention.

FIG. 3 illustrates a cross-sectional side view of an intermediate structure of a SONOS-type device 300 having a nitridized oxide tunneling layer according to an embodiment of the present invention. It should be appreciated that various other SONOS embodiments disclosed herein may also be employed. Thus, while the features of FIG. 3 may be referenced throughout the description, the present invention is not limited solely to this embodiment.

In one embodiment, substrate 308 is a bulk substrate comprised of a single crystal of a material which may include, but is not limited to, silicon, germanium, silicon-germanium or a III-V compound semiconductor material. In another embodiment, substrate 308 is comprised of a bulk layer with a top epitaxial layer. In a specific embodiment, the bulk layer is comprised of a single crystal of a material which may include, but is not limited to, silicon, germanium, silicon/germanium, a III-V compound semiconductor material and quartz, while the top epitaxial layer is comprised of a single crystal layer which may include, but is not limited to, silicon, germanium, silicon/germanium and a III-V compound semiconductor material. In another embodiment, substrate 308 is comprised of a top epitaxial layer on a middle insulator layer which is above a lower bulk layer. The top epitaxial layer is comprised of a single crystal layer which may include, but is not limited to, silicon (i.e. to form a silicon-on-insulator (SOI) semiconductor substrate), germanium, silicon/germanium and a III-V compound semiconductor material. The insulator layer is comprised of a material which may include, but is not limited to, silicon dioxide, silicon nitride and silicon oxy-nitride. The lower bulk layer is comprised of a single crystal which may include, but is not limited to, silicon, germanium, silicon/germanium, a III-V compound semiconductor material and quartz. Substrate 308 and, hence, the channel region 312 between the source and drain regions 310, may comprise dopant impurity atoms. In a specific embodiment, the channel region is doped P-type and, in an alternative embodiment, the channel region is doped N-type.

Source and drain regions 310 in substrate 308 may be any regions having opposite conductivity to the channel region 312. For example, in accordance with an embodiment of the present invention, source and drain regions 310 are N-type doped while channel region 312 is P-type doped. In one embodiment, substrate 308 is comprised of boron-doped single-crystal silicon having a boron concentration in the range of $1 \times 10^{15}$-$1 \times 10^{19}$ atoms/cm$^3$. Source and drain regions 310 are comprised of phosphorous- or arsenic-doped regions having a concentration of N-type dopants in the range of $5 \times 10^{16}$-$5 \times 10^{19}$ atoms/cm$^3$. In a specific embodiment, source and drain regions 310 have a depth in substrate 308 in the range of 80-200 nanometers. In accordance with an alternative embodiment of the present invention, source and drain regions 310 are P-type doped while the channel region of substrate 308 is N-type doped.

The SONOS-type device 300 further includes, over channel region 312, a gate stack 302 including an ONO stack 304, a gate layer 314 and a gate cap layer 325. The ONO stack 304 further includes tunneling layer 316, a charge trapping layer 318 and a blocking layer 320.

In an embodiment, the tunneling layer 316 includes a nitridized oxide. Because programming and erase voltages produce large electric fields across a tunneling layer, on the order of 10 MV/cm, the program/erase tunneling current is more a function of the tunneling layer barrier height than the tunneling layer thickness. However, during retention, there is no large electric field present and so the loss of charge is more a function of the tunneling layer thickness than barrier height. To improve tunneling current for reduced operating voltages without sacrificing charge retention, in a particular embodiment, the tunneling layer 316 is a nitridized oxide. Nitridation increases the dielectric constant (K) of the tunneling layer by inducing nitrogen to an otherwise pure silicon dioxide film. In certain embodiments, the tunneling layer 316 of nitridized oxide has the same physical thickness as a conventional SONOS-type device employing pure oxygen tunnel oxide. In such embodiments, the charge trapping layer 318 charges during program/erase faster than a pure oxygen tunnel oxide of that thickness because relatively less of the large electric field from the control gate is dropped across the nitridized tunnel oxide (due to the relatively higher permittivity of nitridized tunnel oxide). These embodiments enable the SONOS-type device 300 achieve, with a reduced program/erase voltage, the same program/erase voltage threshold level (VTP/VTE) as a conventional SONOS-type device. In a particular embodiment, the SONOS-type device 300 employs a tunneling layer 316 having nitridized tunnel oxide with a physical thickness between 1.5 nm and 2.2 nm, and preferably between 1.9 nm and 2.2 nm. These embodiments further enable the SONOS-type device 300 to have a lower EOT and thereby operate with increased retention times for a program/erase voltage approximately equal to a conventional SONOS-type device. The SONOS-type device 300 may employ a tunneling layer 316 having nitridized tunnel oxide with a physical thickness greater than that of a non-nitridized tunneling layer operable at the same program/erase voltages. In one particular embodiment, the nitridized tunneling layer has a physical thickness between 2.0 nm and 2.5 nm.

Figure 4:
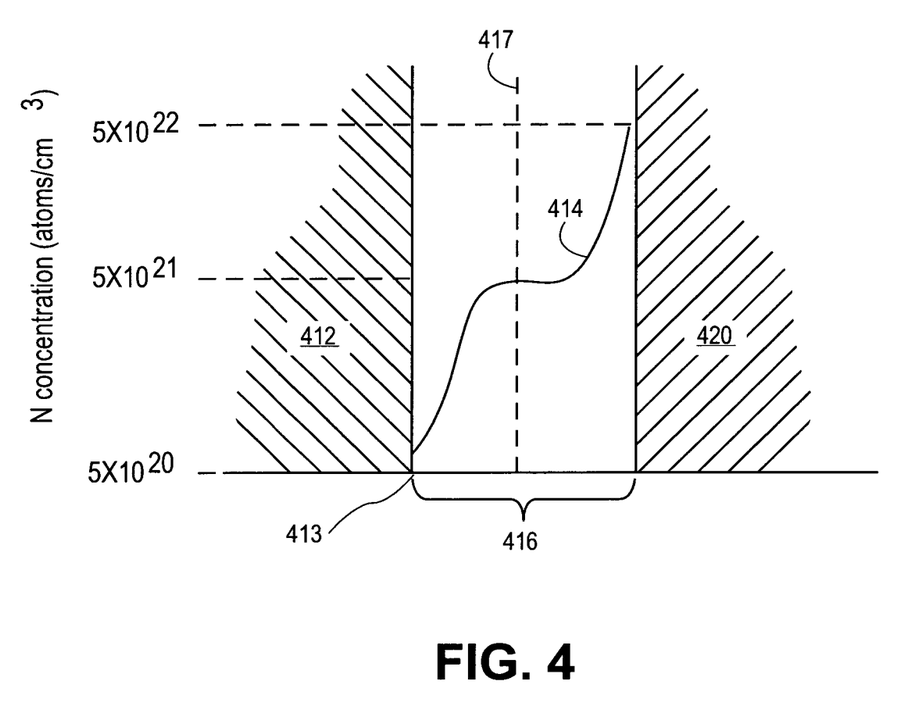
FIG. 4 illustrates the nitrogen concentration profile of the nitridized oxide tunneling layer in accordance with an embodiment of the present invention.

In a further embodiment, the tunneling layer 316 is nitridized in a particular manner to reduce the trap density at the substrate interface to improve charge retention. For particular embodiments in which the nitridized oxide tunneling layer is scaled to be the same physical thickness as a pure oxygen tunnel oxide, charge retention may be approximately the same as the pure oxygen tunnel oxide of the same thickness. Referring to FIG. 4, depicting an approximate nitrogen concentration profile within one embodiment of the tunneling layer 416, the nitrogen concentration 414 decreases rapidly toward the interface 413 to limit the formation of a silicon nitride ($Si_3N_4$) layer in contact with the substrate 412. A silicon nitride layer, comprising polar molecules, detrimentally increases the trap density if present at interface 413, thereby reducing charge retention via trap to trap tunneling. As further shown in the embodiment of FIG. 4, 25% of the thickness of the tunneling layer 416 proximate to the interface 413, is nitridized to have a nitrogen concentration 414 less than $1 \times 10^{21}$ nitrogen atoms/cm$^3$ while 25% of the thickness of the tunneling layer 416 proximate to the charge trapping layer 420 is nitridized to have at least $1 \times 10^{21}$ nitrogen atoms/cm$^3$.

In one embodiment, nitridization of oxide within the tunneling layer reduces its energy barrier and increases the dielectric constant relative to a pure oxide tunneling layer. As shown in FIG. 3, tunneling layer 316 is annotated for illustration purposes with a centerline 317. FIG. 4 depicts a similar centerline 417 with one half the thickness of the tunneling layer 416 proximate the substrate 412 and one half the thickness of the tunneling layer 416 proximate the charge trapping layer 420. In a particular embodiment, the nitrogen concentration 414 at the centerline 417 is between $9 \times 10^{20}$ and $1 \times 10^{21}$ atoms/cm$^3$. In one such embodiment, the nitrogen concentration 414 is below $1 \times 10^{21}$ atoms/cm$^3$ throughout the first 25% of the thickness of the tunneling layer 416 and reaches approximately $1 \times 10^{21}$ atoms/cm$^3$ at 50% of the thickness of the tunneling layer 416, or at the centerline 417. In a further embodiment, the nitrogen concentration 414 is above $5 \times 10^{21}$ atoms/cm$^3$ within the last 25% of the thickness of the tunneling layer 416, proximate the charge trapping layer 420. In an exemplary implementation, for a 2.2 nm tunneling layer, the nitrogen concentration 414 is below $1 \times 10^{21}$ atoms/cm$^3$ within the first 0.8 nm of the tunneling layer proximate the substrate 412 and is at least $1 \times 10^{21}$ atoms/cm$^3$ at 1.1 nm of the tunneling layer 416 thickness. In this manner, with a particular embodiment of the nitridation oxidation method disclosed elsewhere herein, the programming/erase $V_{CG}$ may be reduced without a significant reduction in charge retention of a scaled SONOS-type device. For example, in a particular embodiment, the nitridized oxide tunneling layer provides an electron tunneling barrier height between 2.3 electron volts (eV) and 3.0 eV, and a hole tunneling barrier height between 2.5 eV and 4.25 eV.

The charge trapping layer 318 of the SONOS-type device 300 may further include any commonly known charge trapping material and have any thickness suitable to store charge and, modulate the threshold voltage of the device. In certain embodiments, charge trapping layer 318 is silicon nitride ($Si_3N_4$), silicon-rich silicon nitride, or silicon oxynitride. In one particular embodiment, the charge trapping layer 318 has a non-uniform stoichiometry across the thickness of charge trapping layer. For example, the charge trapping layer 318 may further include at least two oxynitride layers having differing compositions of silicon, oxygen and nitrogen. In one such embodiment, a bottom oxynitride within trapping layer 318 has a first composition with a high silicon concentration, a high oxygen concentration and a low nitrogen concentration to provide an oxygen-rich oxynitride. This first oxynitride may have a physical thickness between 2.5 nm and 4.0 nm corresponding to an EOT of between 1.5 nm and 5.0 nm. The charge trapping layer 318 may further include a top oxynitride with a high silicon concentration, a high nitrogen concentration and a low oxygen concentration to produce a silicon-rich oxynitride. This second oxynitride may have a physical thickness of 6.0 nm for a charge trapping layer 318 with a net physical thickness of 9.0 nm.

Completing the ONO stack 304, the blocking layer 320 of the SONOS-type device 300 may be any commonly known material with any thickness suitable to maintain a barrier to charge leakage without significantly decreasing the capacitance of gate stack. In one embodiment, blocking layer 320 comprises a high-k dielectric layer which may include, but is not limited to, hafnium oxide, zirconium oxide, hafnium silicate, hafnium oxy-nitride, hafnium zirconium oxide and lanthanum oxide. In another embodiment, the blocking layer 320 is silicon dioxide or silicon oxynitride with a physical thickness between about 3.0 nm and about 5.0 nm.

Over the ONO stack 304 is a gate layer 314. The gate layer 314 may be any conductor or semiconductor material. In one such embodiment, the gate layer 314 is poly-silicon (poly). In another embodiment, the gate layer 314 contains a metal, such as, but not limited to, hafnium, zirconium, titanium, tantalum, aluminum, ruthenium, palladium, platinum, cobalt and nickel, their silicides, their nitrides and their carbides. In one particular embodiment, the gate layer 314 is poly-silicon having a physical thickness of between 70 nm and 250 nm.

As further shown in FIG. 3, the SONOS-type device 300 includes a gate cap layer 325 super adjacent to the gate layer 314 and has approximately the same critical dimensions as the gate layer 314 and ONO stack 304. In certain embodiments, the gate cap layer 325 forms the top layer of the gate stack 302 and provides a hard mask during patterning of the gate layer 314 and ONO stack 304. In some embodiments, the gate cap layer 325 facilitates formation of self aligned contacts (SAC) to the SONOS devices. The gate cap layer 325 may be comprised of any material capable providing the necessary selectivity to subsequent etch processes, such as, but not limited to, silicon dioxide, silicon nitride, and silicon oxynitride. In other embodiments, no gate cap layer 325 is included a part of the gate stack.

Figure 5:
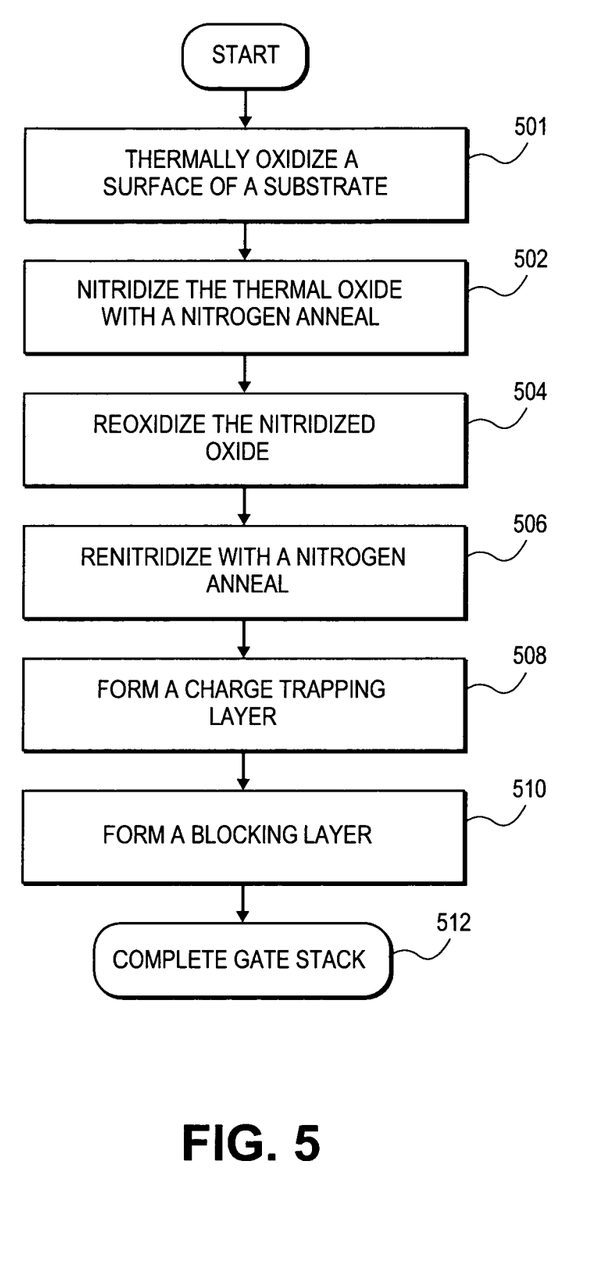
FIG. 5 is a flow chart of method forming an ONO structure including a nitridized oxide tunneling layer for a nonvolatile trapped-charge memory device according to an embodiment of the present invention.

FIG. 5 depicts a flow chart of a method for forming a SONOS-type device having a tunneling layer formed with nitridized oxide, such as tunneling layer 316 depicted in FIG. 3. Nitridation of the tunnel oxide in a scaled SONOS device is challenging because improper nitridation of the tunnel oxide results in a greater number of interface traps. Transistor threshold voltages ($V_T$) shift upward as a result of interface traps and also erased-state retention is reduced with greater interface trap density, because trapped holes can tunnel out of the trapping nitride to fill available interface trap states. To avoid these issues, in a particular embodiment, the nitridized tunnel oxide method depicted in FIG. 5 is employed. In one such embodiment, a nitrogen concentration profile in an oxide tunneling layer may approximate that depicted in FIG. 4.

The method of FIG. 5 begins with forming a nitridized tunnel oxide over a silicon-containing layer on a surface of the substrate. In an embodiment, tailoring of the nitrogen profile in the nitridized tunnel oxide of a SONOS-type device is accomplished with a multi-step nitridation and oxidation method. At operation 501, a thin thermal oxide is formed from a silicon containing layer on a surface of a substrate, such as substrate 308 of FIG. 3. Because a good interface with the substrate is necessary, formation of a chemical oxide may preface the thermal oxidation. In a particular embodiment, therefore, a chemical oxide is present during the thermal oxidation (as opposed to performing a conventional "HF last" pre-clean). In one such embodiment, the chemical oxide is grown with ozonated water to form a chemical oxide layer with a thickness of approximately 1.0 nm.

The thermal oxide is formed to a thickness of between approximately 1.0 nm and 1.8 nm. In a particular embodiment, the thermal oxide is formed to a thickness of between 1.0 nm and 1.2 nm. Thus, in embodiments where a 1.0 nm chemical oxide is present during the thermal oxidation of operation 501, the thickness of the surface oxide does not substantially increase, however the quality of the oxide is improved. In a further embodiment, the oxide is of relatively low density to facilitate subsequent incorporation of a significant wt % of nitrogen. Too low of a film density, however, will result in too much nitrogen at the silicon substrate interface. Formation of the silicon dioxide layer at operation 501 further serves as a means to block additional substrate oxide formation during subsequent thermal processing, discussed further below. In one embodiment, an atmospheric pressure vertical thermal reactor (VTR) is employed to grow the thermal oxide at a temperature between 680 degrees Celsius (° C.) and 800° C. in the presence of an oxidizing gas such as, oxygen ($O_2$), nitrous oxide ($N_2O$), nitric oxide (NO), ozone ($O_3$), and steam ($H_2O$). Depending on the oxidizer chosen, the oxidation of operation 501 may be from 3.5 minutes to 20 minutes in duration. In one atmospheric embodiment, employing $O_2$ gas at a temperature between 700° C. and 750° C., a process time between 7 minutes and 20 minutes forms an approximately 1.0 nm silicon dioxide film.

In another embodiment, the oxidation operation 501 is performed with a sub-atmospheric processor such as the Advanced Vertical Processor (AVP) commercially available from AVIZA technology of Scotts Valley, Calif. The AVP may be operated in the temperature range described above for a VTR embodiment and at a pressure between 1 Torr (T) and atmospheric pressure. Depending on the operating pressure, the oxidation time to form a thermal silicon dioxide film of between approximately 1.0 nm and 1.8 nm in thickness may extend up to nearly an hour, as may be determined by one of ordinary skill in the art.

Next, at operation 502 in the multiple oxidation nitridation method embodiment depicted in FIG. 5, the thermal oxide formed at operation 501 is nitridized. Generally, at operation 502, a nitrogen anneal is performed to increase the dielectric constant ($\kappa$) and reduce the fixed charge of the thermal oxide layer. In one embodiment, the nitrogen anneal employs a hydrogenated nitrogen source, such as ammonia ($NH_3$). In another embodiment, the nitrogen anneal employs a deuterated nitrogen source, such as deuterated ammonia ($ND_3$). In one specific embodiment, the nitrogen anneal is performed at a temperature between 700° C. and 850° C. for between 3.5 minutes and 30 minutes. In another specific embodiment, the nitrogen anneal is performed at a temperature between 725° C. and 775° C., for between 3.5 minutes and 30 minutes. In one such embodiment, $NH_3$ is introduced at atmospheric pressure at a temperature of between 725° C. and 775° C., for between 3.5 minutes and 30 minutes. In an alternative embodiment, a sub-atmospheric $NH_3$ anneal is performed at 800° C. to 900° C. for 5 minutes to 30 minutes in a processor such as the AVP. In still other embodiments, commonly known nitrogen plasma and thermal anneal combinations are performed.

Following operation 502, a reoxidation is performed at operation 504. In one embodiment, during the reoxidation process, an oxidizing gas is thermally cracked to provide oxygen radicals close to the film surface. The oxygen radicals eliminate nitrogen and hydrogen trap charge. The reoxidation operation 502 also grows an additional oxide at the substrate interface to provide a physical offset between the substrate and a nitrogen concentration within the tunneling layer. For example, referring back to FIG. 3, the reoxidation helps to separate the substrate interface 313 from a nitrogen concentration within the tunneling layer 316. As specifically shown in FIG. 4, for one implementation, the nitrogen concentration 414 in the tunneling layer 416 at the substrate interface 413 is significantly below $1\times10^{21}$ atoms/cm$^3$ and may be on the order of $1\times10^{20}$ atoms/cm$^3$. This offset in the nitrogen from the substrate interface improves retention of a SONOS-type device. In one embodiment, the thickness of the oxide grown at the substrate interface 413 is limited to between 1.2 nm and 2.5 nm. At operation 505, the reoxidation process conditions are chosen such that the thickness of the thermal oxide formed at operation 501 prevents oxidation beyond a thickness of approximately 2.5 nm, which could render a tunneling layer devoid of any advantageous nitrogen concentration. Commonly known oxidizers may be employed for the reoxidation process, such as, but not limited to, NO, $N_2O$, $O_2$, $O_3$ and steam. Any such oxidizers may be introduced with known thermal processors operating at a temperature of between 800° C. and 850° C. Depending on the operating parameters, reoxidation time may be anywhere between 5 minutes and 40 minutes. In a particular embodiment, NO is employed in an atmospheric furnace operated at a temperature between 800° C. and 850° C. for a process time of approximately 15 minutes to form a nitridized oxide film that is approximately 2.2 nm in thickness on a silicon substrate. In one such embodiment, the reoxidized film 2.2 nm thick forms a region between 0.5 nm and 0.8 nm proximate to the interface with the silicon substrate, the region having a nitrogen concentration below $1\times10^{21}$ atoms/cm$^3$.

Following the reoxidation of operation 504, a second nitrogen anneal is performed to renitridize the tunneling layer in the multiple oxidation nitridation embodiment depicted in FIG. 5. A second nitrogen anneal is employed to further increase the dielectric constant of the tunneling layer without detrimentally introducing a large number of hydrogen or nitrogen traps at the substrate interface. In one embodiment, the second nitrogen anneal of operation 506 is performed with conditions identical to the anneal performed in operation 502. In another embodiment, the second nitrogen anneal of operation 506 is performed at a higher temperature than the first nitrogen anneal of operation 502 to introduce additional nitrogen into the tunneling layer. In one embodiment, the nitrogen anneal employs a hydrogenated nitrogen source, such as $NH_3$. In another embodiment, the nitrogen anneal employs a deuterated nitrogen source, such as $ND_3$. In a specific embodiment, the nitrogen anneal of operation 506 employs $NH_3$ at atmospheric pressure and a temperature between 750° C. and 950° C. with a processing time of between 3.5 minutes and 30 minutes. In another particular embodiment, the $NH_3$ anneal is performed at atmospheric pressure between 800° C. and 850° C. for between 5 minutes and 10 minutes.

As described, operations 501 through 506 depicted in FIG. 5 provide two oxidation operations and two nitridation operations. The iterative oxidation, nitridation scheme depicted enables specific tailoring of the nitrogen concentration in the tunneling layer to achieve both a reduction in programming voltage or increase in programming speed and an increase in memory retention of a SONOS-type device. The successive nature of the oxidation, nitridation, reoxidation, renitridation operations 501-506 enable an appreciable nitrogen concentration in a tunneling layer less than 2.5 nm thick while providing an interface between the tunneling layer and the substrate that has very little nitrogen and hydrogen traps. The independent oxidation, nitridation, reoxidation, renitridation operations 501-506 enable the first and second oxidations and first and second nitridation to be performed with independently engineered conditions to provide greater degrees of freedom in tailoring the nitrogen concentration profile in a tunneling layer. In one advantageous embodiment, operation 501, 502, 504 and 506 are successively performed in a single thermal processor without removing the substrate from the processor between operations. In one such embodiment, process pressure is held at atmosphere for operations 501-506. First, oxidation operation 501 is performed at a temperature of between 700° C. and 750° C. Gas flows are then modified as prescribed to perform the nitrogen anneal of operation 502 at a temperature between 725° C. and 775° C. The furnace temperature is then ramped up to between 800° C. and 850° C. and gas flows are again modified to perform the reoxidation of operation 504. Finally, while holding the furnace between 800° C. and 850° C., gas flows are again modified to perform the second nitrogen anneal of operation 506.

With the nitridized oxide tunneling layer 316 of FIG. 3 substantially complete, fabrication of the SONOS-type device 300 may continue with formation of a charge trapping layer, such as charge trapping layer 318. In one embodiment, nitride or oxynitride charge trapping layers are formed at operation 508 of FIG. 5 in a low pressure CVD process using a silicon source, such as silane ($SiH_4$), dichlorosilane ($SiH_2Cl_2$), tetrachlorosilane ($SiCl_4$) or Bis-TertiaryButylAmino Silane (BTBAS), a nitrogen source, such as $N_2$, $NH_3$, $N_2O$ or nitrogen trioxide ($NO_3$), and an oxygen-containing gas, such as $O_2$ or $N_2O$. Alternatively, gases in which hydrogen has been replaced by deuterium can be used, including, for example, the substitution of $ND_3$ for $NH_3$. The substitution of deuterium for hydrogen advantageously passivates Si dangling bonds at the substrate interface 313, thereby increasing an NBTI (Negative Bias Temperature Instability) lifetime of SONOS-type devices.

In one exemplary implementation, an oxynitride charge trapping layer can be deposited over a tunneling layer by placing the substrate in a deposition chamber and introducing a process gas including $N_2O$, $NH_3$ and DCS, while maintaining the chamber at a pressure of from about 5 millitorr (mT) to about 500 mT, and maintaining the substrate at a temperature of from about 700° C. to about 850° C. and more preferably at least about 780° C., for a period of from about 2.5 minutes to about 20 minutes. In a further embodiment, the process gas can include a first gas mixture of $N_2O$ and $NH_3$ mixed in a ratio of from about 8:1 to about 1:8 and a second gas mixture of $SiH_2Cl_2$ and $NH_3$ mixed in a ratio of from about 1:7 to about 7:1, and can be introduced at a flow rate of from about 5 to about 200 standard cubic centimeters per minute (sccm). It has been found that an oxynitride layer produced or deposited under these condition yields a silicon-rich, oxygen-rich, oxynitride layer. Formation of the charge trapping layer may further involve a CVD process employing a first gas mixture of $N_2O$ and $NH_3$ mixed in a ratio of from about 8:1 to about 1:8 and a second gas mixture of $SiH_2Cl_2$ and $NH_3$ mixed in a ratio of from about 1:7 to about 7:1, introduced at a flow rate of from about 5 to about 20 sccm to yield a silicon-rich, nitrogen-rich, and oxygen-lean oxynitride layer.

In one embodiment, formation of a charge trapping layer at operation 508 is performed sequentially in the same processing tool used to form the tunneling layer without unloading the substrate from the deposition chamber between operations 506 and 508. In a specific embodiment, the charge trapping layer is deposited without altering the temperature at which the substrate was heated during the second nitrogen anneal of operation 506. In one embodiment, the charge trapping layer is deposited sequentially and immediately following nitridation of the tunneling layer at operation 506 by modifying the flow rate of $NH_3$ gas, and introducing N2O and $SiH_2Cl_2$ to provide the desired gas ratios to yield either a silicon-rich and oxygen-rich, a silicon rich and nitrogen-rich oxynitride layer, or both layers in a dual-layer implementation.

Following operation 508, a blocking layer can be formed at operation 510 by any suitable means including, for example, thermal oxidation or deposition with CVD techniques. In a preferred embodiment, the blocking layer is formed with a high-temperature CVD process. Generally, the deposition process involves providing a silicon source, such as $SiH_4$, $SiH_2Cl_2$, or $SiCl_4$ and an oxygen-containing gas, such as $O_2$ or $N_2O$ in a deposition chamber at a pressure of from about 50 mT to about 1000 mT, for a period of from about 10 minutes to about 120 minutes while maintaining the substrate at a temperature of from about 650° C. to about 850° C. Preferably, the blocking layer is deposited sequentially in the same processing tool employed to form the charge trapping layer(s) at operation 508. More preferably, the blocking layer is formed in the same processing tool as is both the charge trapping layer(s) and the tunneling layer without removing the substrate between operations.

Finally, as depicted in FIG. 5 the method may proceed at operation 512 with formation of a gate layer, such as the gate layer 314 of FIG. 3, to complete the gate stack of a SONOS-type device. The silicon containing layer can be, for example, a poly-silicon layer deposited by a CVD process to form a control gate of a SONOS-type device. In certain embodiments, operation 512 may further include formation of a gate cap layer, such as gate cap layer 325 depicted in FIG. 3. With the completion of the gate stack fabrication, further processing may occur as known in the art to conclude fabrication of the SONOS-type device 300.

Figure 6:
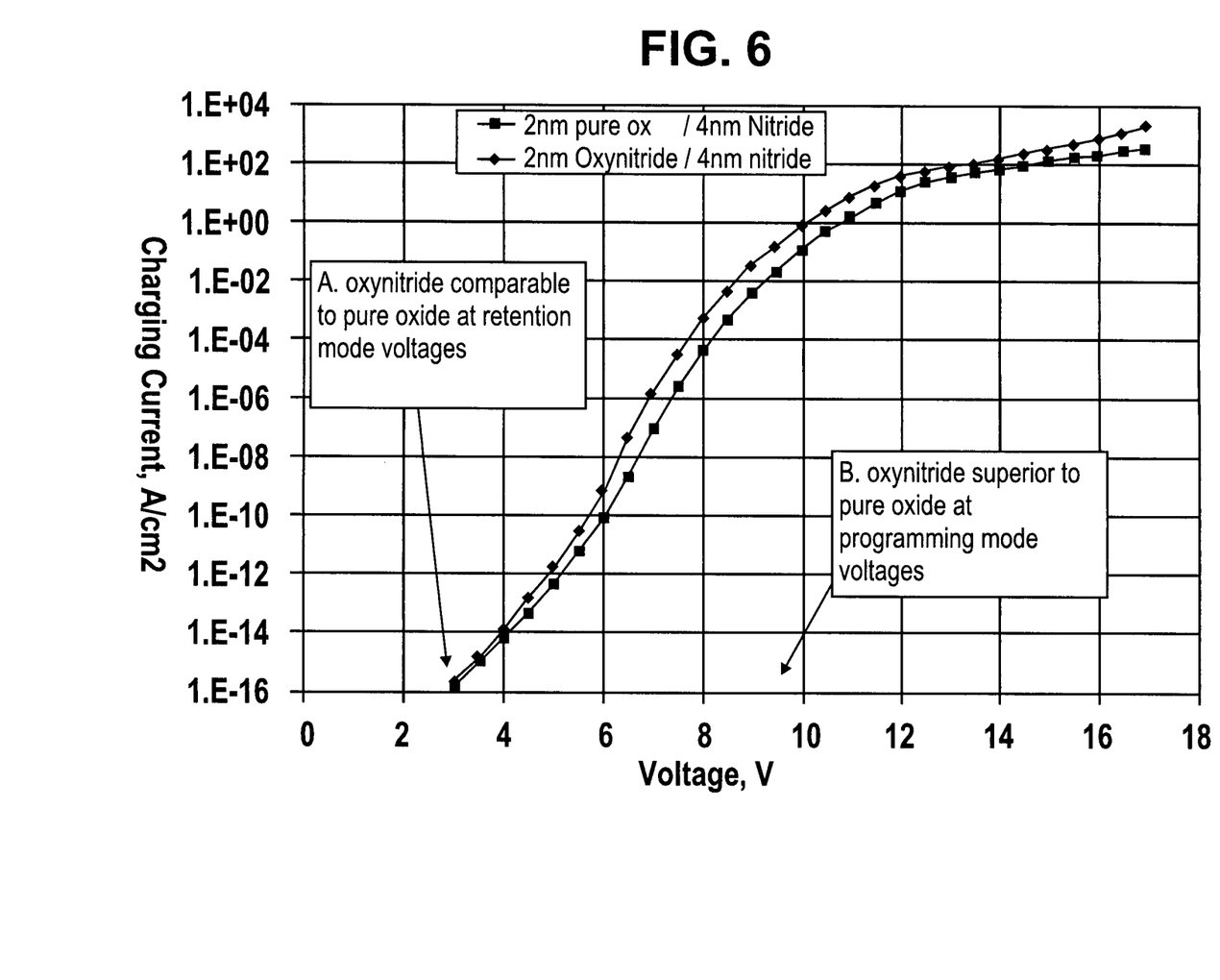
FIG. 6 illustrates a graph depicting simulation showing reduction in programming voltage attributable to a nitridized oxide tunneling layer in accordance with an embodiment of the present invention.

FIG. 6 illustrates a graph depicting simulation showing reduction in programming voltage attributable to a nitridized oxide tunneling layer in accordance with an embodiment of the present invention. As shown, leakage current at retention voltages for 20 Å pure oxide tunneling layer and 40 Å nitride charge trapping layer is equal to 20 Å nitridized oxide tunneling layer and 40 Å charge trapping layer nitride, while charging current for the nitridized oxide tunneling layer at programming voltages is greater than that of the pure oxide tunneling layer. Thus, at a program or erase voltage of 9.1 V, a nitridized oxide tunneling layer in accordance with the present invention may provide the same program erase level achieved with a 10 V program or erase voltage and a conventional pure oxide tunneling layer.

Although the present invention has been described in language specific to structural features and/or methodological acts, it is to be understood that the invention defined in the appended claims is not necessarily limited to the specific features or acts described. The specific features and acts disclosed are to be understood as particularly graceful implementations of the claimed invention in an effort to illustrate rather than limit the present invention.

What is claimed is:

1. A nonvolatile trapped-charge memory device, comprising:
   a tunneling layer on a substrate, a charge trapping layer on the tunneling layer, wherein the charge trapping layer comprises an oxygen-rich oxynitride to form a SONOS-type device, and
a blocking layer on the charge trapping layer,
wherein the tunneling layer thickness is no greater than 2.5 nm and further comprises:
  a first region comprising approximately 25% of the tunneling layer thickness proximate to the substrate having a nitrogen concentration lower than a middle region, and
  a second region comprising approximately 25% of the tunneling layer thickness proximate to the charge trapping layer having a nitrogen concentration higher than the middle region, wherein the middle region is located between the first region and the second region, and
wherein the nitrogen concentration decreases from a first interface between the second region and the charge trapping layer to the middle region, and from the middle region to a second interface between the first region and the substrate to reduce nitrogen and hydrogen trap density at the second interface, and wherein the middle region and the second region comprising approximately 75% of the tunneling layer, the second region comprises a nitrogen concentration that is at least $1 \times 10^{21}$ atoms/cm$^3$.

2. The nonvolatile trapped-charge memory device of claim 1, wherein the first region has a nitrogen concentration that is at least one order of magnitude lower than the second region.

3. The SONOS-type device of claim 1, wherein the substrate is silicon and the tunneling layer is a non-homogeneous silicon oxynitride film.

4. The SONOS-type device of claim 1, wherein the tunneling layer further comprises an additional oxide at the second interface to provide a physical offset between the substrate and the nitrogen concentration within the tunneling layer.

5. The SONOS-type device of claim 1, wherein the tunneling layer comprises an oxide film nitrided by a nitrogen anneal using deuterated ammonia (ND$_3$) as a nitrogen source to provide a second interface between the first region and the substrate comprising passivated Si bonds.

6. The SONOS-type device of claim 1, wherein the tunneling layer comprises an oxide film nitrided by a nitrogen anneal using a nitrogen source, and wherein the oxide film comprises a low density oxide film.

7. A nonvolatile trapped-charge memory device, comprising:
  a tunneling layer on a substrate,
  a charge trapping layer on the tunneling layer, wherein the charge trapping layer comprises an oxygen-rich oxynitride in contact with the tunneling layer having a high silicon concentration, a high oxygen concentration and a low nitrogen concentration, and
  a blocking layer on the charge trapping layer,
  wherein the tunneling layer comprises a nitrided oxide film including a first region proximate to the substrate, and a second region proximate to the charge trapping layer, and wherein the nitrogen concentration decreases from a first interface between the second region and the charge trapping layer to a second interface between the first region and the substrate to reduce nitrogen and hydrogen trap density at the second interface, wherein a first region comprises approximately 25% of the tunneling layer thickness and comprises a nitrogen concentration that is at least $1 \times 10^{21}$ atoms/cm$^3$.

8. The nonvolatile trapped-charge memory device of claim 7, wherein the tunneling layer further comprises an additional oxide at the second interface to provide a physical offset between the substrate and the nitrogen concentration within the tunneling layer.

9. The nonvolatile trapped-charge memory device of claim 7, wherein the nitrided oxide film comprises a nitrided oxide film nitrided by a nitrogen anneal using deuterated ammonia (ND$_3$) as a nitrogen source to provide a second interface between the first region and the substrate comprising passivated Si bonds.

10. The nonvolatile trapped-charge memory device of claim 7, wherein the oxide film comprises a low density oxide film.

* * * * *